United States Patent
Nishiwaki et al.

(10) Patent No.: US 7,943,054 B2
(45) Date of Patent: May 17, 2011

(54) METHOD FOR MANUFACTURING SEMICONDUCTOR INTEGRATED CIRCUIT DEVICE

(75) Inventors: Tomohiro Nishiwaki, Anpachi-gun (JP); Kazushige Kaneko, Gifu (JP); Tetsuya Yamada, Gifu (JP); Yoji Nomura, Mizuho (JP)

(73) Assignees: Sanyo Electric Co., Ltd., Moriguchi (JP); Sanyo Semiconductor Co., Ltd., Ora-gun (JP)

( * ) Notice: Subject to any disclaimer, the term of this patent is extended or adjusted under 35 U.S.C. 154(b) by 675 days.

(21) Appl. No.: 12/076,822

(22) Filed: Mar. 24, 2008

(65) Prior Publication Data

US 2008/0242093 A1  Oct. 2, 2008

(30) Foreign Application Priority Data

Mar. 27, 2007  (JP) .................................. 2007-082124
Mar. 4, 2008   (JP) .................................. 2008-052895

(51) Int. Cl.
*C03C 15/00*   (2006.01)
*C03C 25/68*   (2006.01)
*C23F 1/00*    (2006.01)
*B44C 1/22*    (2006.01)

(52) U.S. Cl. .............................. 216/41; 216/24; 438/689
(58) Field of Classification Search .................... 216/41, 216/24; 438/689
See application file for complete search history.

(56) References Cited

U.S. PATENT DOCUMENTS 7,427,530 B2     9/2008  Bae et al.
2008/0001242 A1  1/2008  Yamada

FOREIGN PATENT DOCUMENTS

| CN | 1624936 A    | 6/2005 |
| JP | A-2001-060713 | 3/2001 |
| JP | A-2004-153032 | 5/2004 |
| JP | A-2005-43793  | 2/2005 |

*Primary Examiner* — Roberts Culbert
(74) *Attorney, Agent, or Firm* — Oliff & Berridge, PLC

(57) ABSTRACT

Cracks are generated in a resist film part used to form an opening part in a photoreceptor part, whereby etching is performed as far as the inter-layer insulating film in unintended portions. In order to prevent this, the resist pattern used as an etching mask is formed in a shape that disperses the stress. The stress is generated because the resist is hardened by post baking after having been exposed and developed. In order to disperse the stress, the opening part of the resist pattern is formed in a planar shape that has no corners.

4 Claims, 6 Drawing Sheets (prior art)

(prior art)

(prior art)

METHOD FOR MANUFACTURING SEMICONDUCTOR INTEGRATED CIRCUIT DEVICE

CROSS-REFERENCE TO RELATED APPLICATION

The priority applications numbers JP2007-082124 and JP2008-052895 upon which this patent application is based is hereby incorporated by the references.

BACKGROUND OF THE INVENTION

1. Field of the Invention

The present invention relates to a semiconductor integrated circuit device in which integrated circuits are formed on a semiconductor substrate containing a photoreceptor part, and more particularly relates to a method for manufacturing a semiconductor integrated circuit device in which opening parts are formed by etching inter-layer insulating films layered on a substrate.

2. Description of the Related Art

In recent years, optical disks such as CDs (compact disks) and DVDs (digital versatile disks) have come to occupy an important position as information recording media. Playback devices for such optical disks detect, using a light detector, the reflected light of the laser light with which the tracks of the optical disk are irradiated, and play back the recorded data on the basis of variations in the intensity of the reflected light.

FIG. 1 is a schematic plan view of a conventional light detector 10.

FIG. 2 is a schematic sectional view passing through the straight line A-A' shown in FIG. 1, and showing the photoreceptor part 11 and wiring structures 12 in a sectional view perpendicular to the semiconductor substrate.

The light detector 10 has a photoreceptor part 11 containing PIN photodiode (PD) diffusion layers 34 divided into 4 segments in a 2×2 array on the surface of the semiconductor substrate 14A in order to detect reflected light. When reflected light of the laser light impinges on the photoreceptor part 11, a very weak photoelectric conversion signal is generated in the photoreceptor part 11. Such a light detector is disclosed in Japanese Laid-Open Patent Application No. 2001-60713. The generated signal is amplified by an amplifier formed in the surrounding area, and is input into an after-stage signal processing circuit.

Furthermore, the respective PD diffusion layers 34 are separated from each other by a separating diffusion layer 33.

The light detector 10 is manufactured by forming a gate oxide film 14B on the semiconductor substrate 14A, and successively layering a first interlayer insulating film 16, first metal layer 17, second interlayer insulating film 18, second metal layer 19, and third interlayer insulating film 20 on top of this. The first metal layer 17 and second metal layer 19 are respectively formed from aluminum (Al) or the like, and are patterned using a photolithographic technique. A wiring structure 12 and a signal line 13A and voltage application line 13B connected to the wiring structures 12 are formed by the patterned first metal layer 17.

The separating diffusion layer 33 is fixed in potential by the voltage application lines 13B via the wiring structures 12. The photoelectric conversion signals generated in the respective PD diffusion layers 34 are read out to the signal line 13A via the wiring structures 12.

In order to maintain the frequency characteristics of the photoelectric conversion signals and suppress the superimposition of noise onto the photoelectric conversion signals, it is necessary that the respective PD diffusion layers and signal lines 13A, and the separating diffusion layer 33 and voltage application lines 13B, all be electrically connected with a low resistance. Accordingly, the wiring structures 12 connected to the signal lines 13A and voltage application lines 13B are extended along the edges of the photoreceptor part 11 as shown in FIG. 1 in order to increase the size, and to form as many contacts as possible with the diffusion layers underneath. As a result, an area with a shape that has corner parts is defined on the photoreceptor part 11 by the wiring structures 12.

After the metal layers and inter-layer insulating films have been layered, the inter-layer insulating films and the like that are layered on top of the photoreceptor part 11 are etched and an opening part 15 is formed in order to increase the incident efficiency of light onto the photoreceptor part 11. The opening part 15 is formed with a shape that is similar to but much smaller than the shape surrounded by the wiring structures 12, and this opening part opens only at the surface of the photoreceptor part.

In order to increase the incident efficiency, it is necessary that the opening part 15 be etched as deeply as possible. When the inter-layer insulating film or the like is etched in order to form this opening part 15, the resist pattern 25 formed on the third inter-layer insulating film 20 is also etched from the surface. Accordingly, in cases where the film thickness of the resist is insufficient, the third inter-layer insulating film 20 underneath the resist is exposed by etching, and places that are not to be formed as the opening part are eaten away.

On the other hand, it is conceivable that the film thickness of the resist might be increased; however, if this occurs, the problem is still presented of a portion of the inter-layer insulating film or the like on the wiring structure 12 being etched.

SUMMARY OF THE INVENTION

The method of the present invention for manufacturing a semiconductor integrated circuit comprises forming an inter-layer insulating film on a semiconductor substrate containing a photoreceptor part; coating the inter-layer insulating film with a resist; forming the resist into a resist pattern; hardening the resist pattern; and etching the inter-layer insulating film by using the resist pattern as a mask. An opening part having a planar shape devoid of corners is formed in the resist pattern on top of the photoreceptor part.

DESCRIPTION OF THE PREFERRED EMBODIMENTS

Embodiments of the present invention will be described below with reference to the attached drawings.

Figure 3:
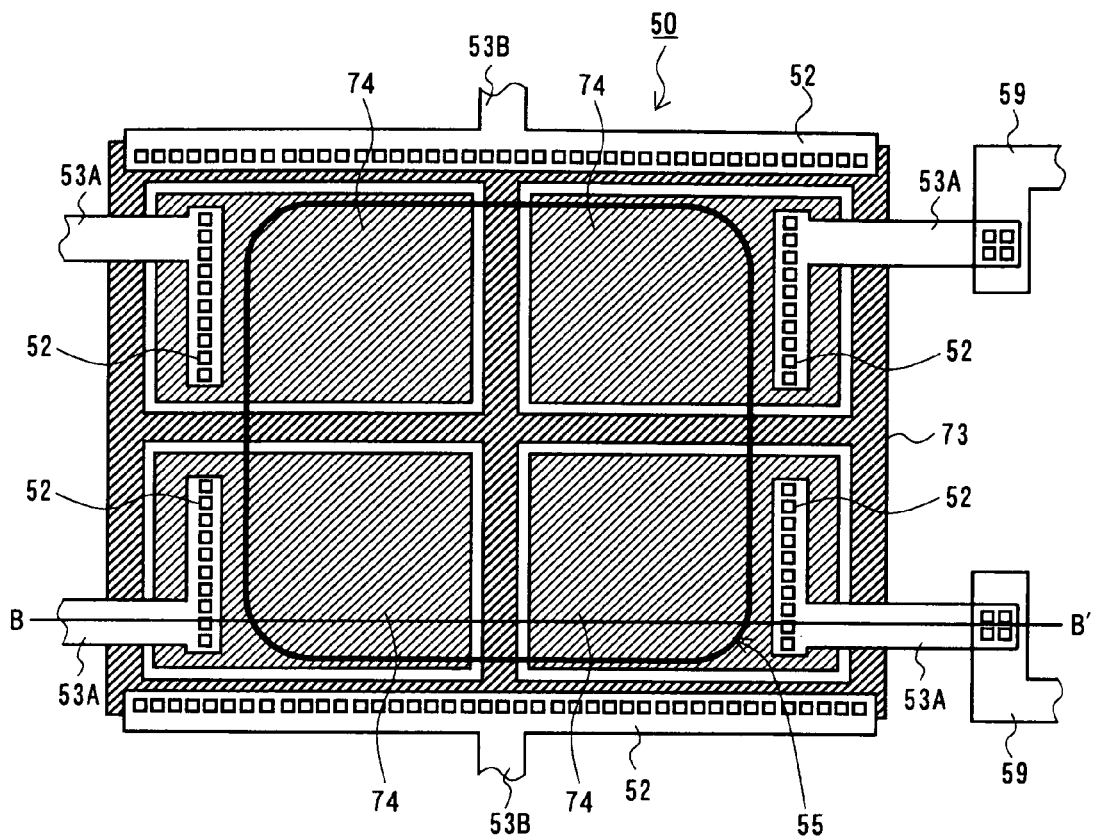
FIG. 3 is a schematic plan view of the light detector of the present invention.

FIG. 3 is a schematic plan view of the light detector 50 in the present embodiment.

Figure 4:
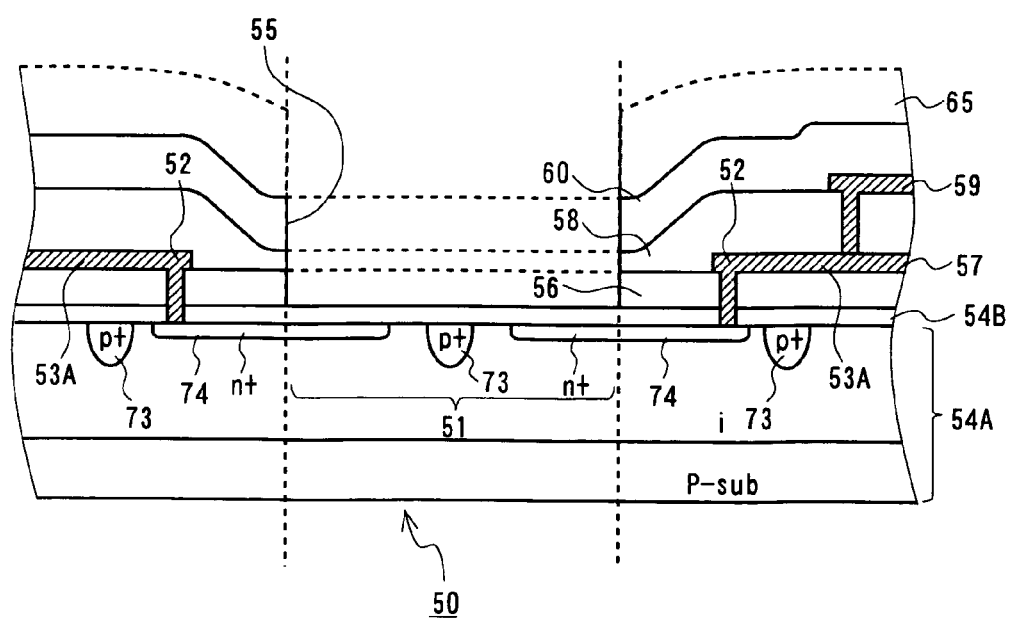
FIG. 4 is a schematic sectional view of the light detector of the present invention.

FIG. 4 is a schematic sectional view showing the photoreceptor part 51 and wiring structure 52 in a section perpendicular to the semiconductor substrate 54 and passing through the straight line B-B' shown in FIG. 3.

The light detector 50 which detects reflected light has a photoreceptor part 51 on the surface of the semiconductor substrate 54A. The photoreceptor part 51 contains a PIN photodiode (PD) diffusion layer 74 which is divided into 4 segments in a 2×2 array. For example, the PD diffusion layer 74 is formed as a cathode region in which a high concentration of an n type impurity is diffused. Furthermore, respective PD diffusion layers 74 are separated from each other by a separating diffusion layer 73. The separating diffusion layer 73 is formed for example by forming this layer as an anode region in which a high concentration of a p type impurity is diffused on the surface of the semiconductor substrate 54A. By forming the PD diffusion layer 74 as a cathode region, it is possible to collect only electrons as a signal charge among the charges produced by the incidence of the reflected light of the laser light on the photoreceptor part 51.

The light detector 50 is manufactured by forming a gate oxide film 54B on the surface of the semiconductor substrate 54A, and then successively layering a first inter-layer insulating film 56, first metal layer 57, second inter-layer insulating film 58, second metal layer 59, and third inter-layer insulating film 60 in that order on top of this. The first metal layer 57 and second metal layer 59 are formed from aluminum (Al) or the like, and are patterned using a photolithographic technique. The wiring structure 52 and the signal lines 53A and voltage application lines 53B connected to the wiring structure 52 are formed by the patterned first metal layer 57.

Here, in the present embodiment, the wiring structure 52 is formed on the semiconductor substrate 54A. As is shown in FIG. 3, a area having a shape which has corner parts in the four corners and which is surrounded by the wiring structure 52 is formed on the photoreceptor part 51.

Furthermore, the wiring structure 52 is electrically connected to the respective PD diffusion layers 74 and separating diffusion layer 73 by a plurality of contacts. Accordingly, the separating diffusion layer 73 has a potential that is fixed by the voltage application lines 53B via the wiring structure 52. For example, a ground potential is applied to the separating diffusion layer 73. Furthermore, the photoelectric conversion signals generated in the respective PD diffusion layers 74 are read out to the signal lines 53A via the wiring structure 52.

After the respective PD diffusion layers 74 and separating diffusion layer 73 have been connected to the wiring structure 52, a second inter-layer insulating film 58 is formed. In the present embodiment, furthermore, the respective inter-layer insulating films are formed for example from TEOS (tetraethoxy-silane), BPSG (borophosphosilicate glass), or SOG (spin on glass).

After the respective metal layers and inter-layer insulating films have been layered, an opening part 55 is formed in the photoreceptor part 51 by etching. The opening part 55 is formed in order to increase the incident efficiency of the reflected light on the photoreceptor part 51.

In order to form the opening part 55, the surface of the third inter-layer insulating film 60 is first coated with a resist. The resist is layered so as to have a thickness that prevents the third inter-layer insulating film 60 from being exposed even if the resist is etched simultaneously with the formation of the opening part. The resist is exposed and developed, and a resist pattern 65 is formed in which the surface of the photoreceptor part 51 is opened. Subsequently, the resist is subjected to post baking, and is hardened. The inter-layer insulating film is etched using the cured resist as an etching mask, and an opening part 55 is formed in the photoreceptor part 51.

Figure 1:
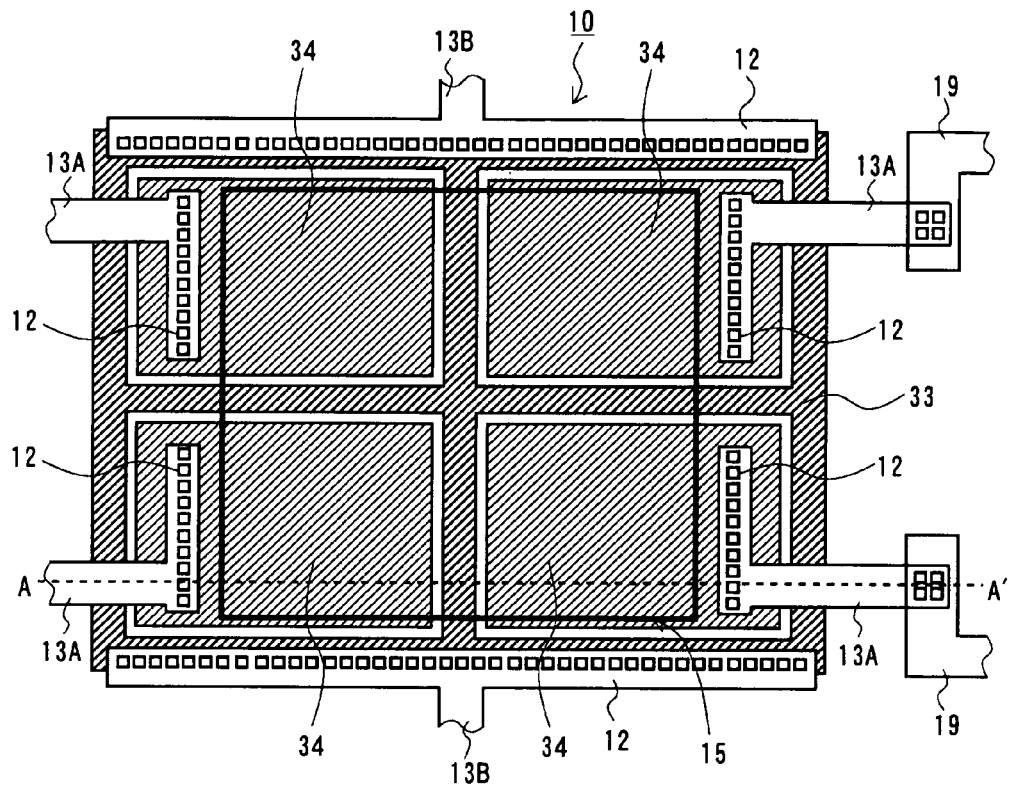
FIG. 1 is a schematic plan view of a conventional light detector.
Figure 2:
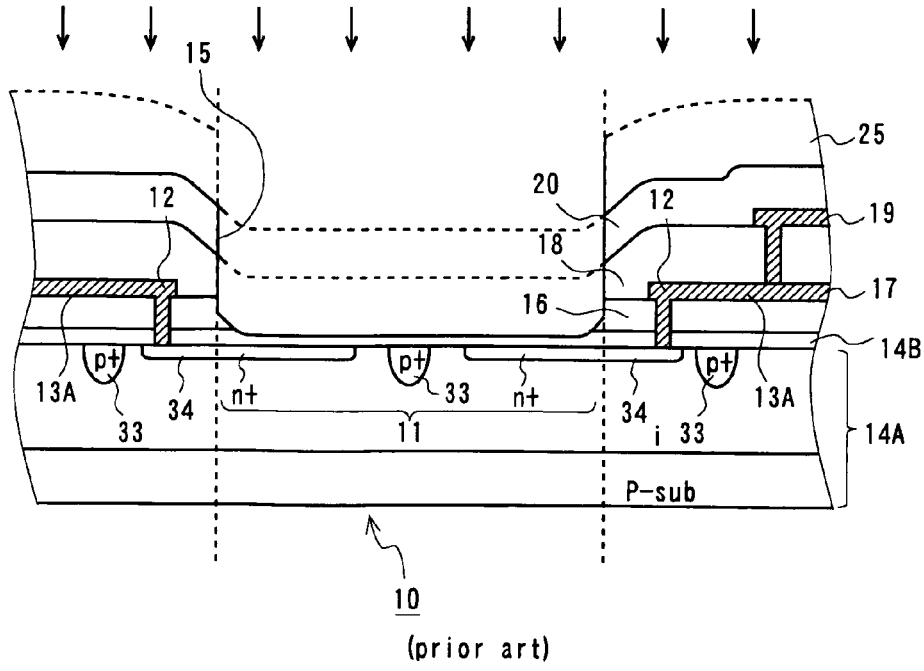
FIG. 2 is a schematic sectional view of a conventional light detector.
Figure 5:
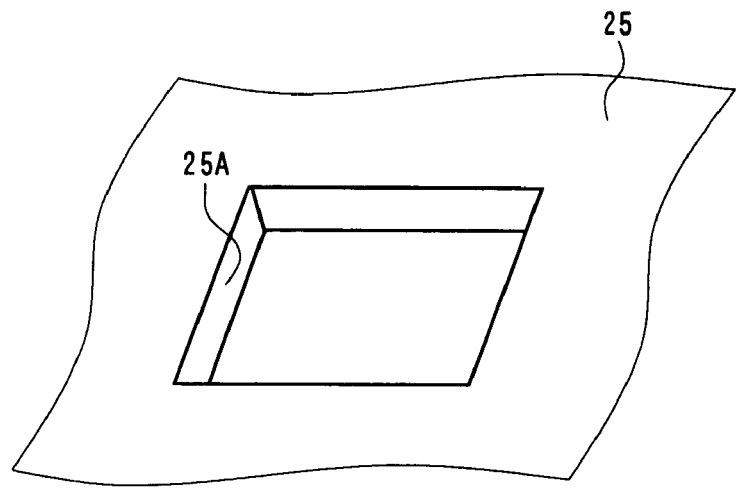
FIG. 5 is a perspective view of a conventional resist pattern prior to post baking.

FIG. 5 is a perspective view showing the shape of a conventional opening part, i.e., the shape of the resist pattern 25. In a conventional technique, as is shown in FIG. 5, the opening part 25A of the resist pattern 25 is formed in a shape having corner parts, e.g., a square shape, in correspondence with the desired shape of the opening part 15. This will be further described below. Furthermore, the symbols in the drawings are assigned so that these symbols are shared in common with FIGS. 1 and 2 showing a conventional light detector 10.

Figure 6:
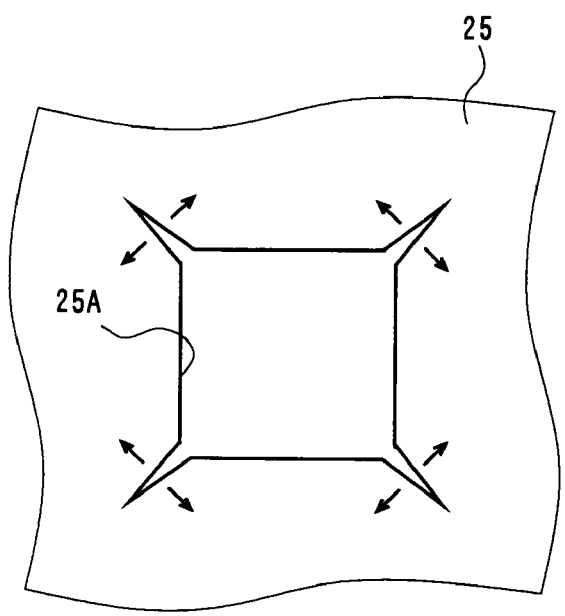
FIG. 6 is a plan view of a conventional resist pattern following post baking.

The resist pattern 25 is formed by coating the third insulating film 20 with a resist, and exposing and developing this resist. FIG. 6 is a plan view of the resist pattern 25 following the performance of post baking on the resist is shown in FIG. 5. The arrows in the drawing indicate stress.

Figure 7:
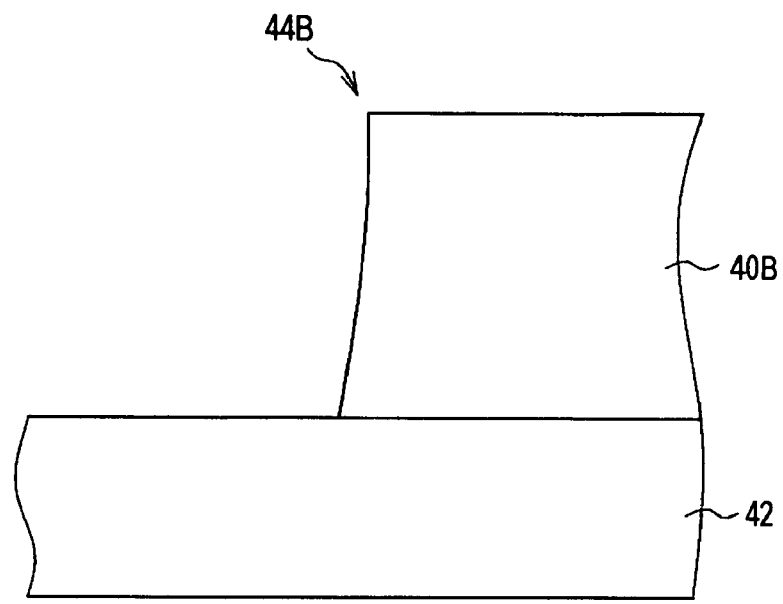
FIG. 7 is a model sectional view of the end part of the resist film.

AS is shown in FIG. 6, cracks are generated in the resist pattern 25 following post baking. Such cracks are generated as a result of a resist with a large film thickness being hardened so that stress concentrated in the corner parts of the opening part 25A of the resist pattern 25 becomes excessive, thus causing stress failure to occur in the resist. FIG. 7 is a model sectional view of the end part of the resist film 40 used to illustrate this stress failure. The boundary portion of the pattern formed in the resist film 40 layered on the substrate 42 is shown in FIG. 7. Depending on the nature of the resist, the edge of the resist film 40 may assume a sharp apical shape as shown in FIG. 7. For example, the thickness of the leading end in an edge 44 with a sharp apical shape (thickness of the resist film 40 clamped between the upper surface 46 and side surface 48 of the resist film 40) may exhibit a thin state from the leading end of the edge to a distal position compared to an edge which has a rounded shape or the like. Accordingly, stress failure tends to occur from the edge 44 corresponding to the corner part of the opening part 15. For example, cracking occurs in the edge 44 positioned in the opening part 15 as a result of stress that is generated when the resist is subjected to post baking following development.

When etching is performed using a resist pattern 25 in which cracking has occurred as an etching mask, the third inter-layer insulating film 20 beneath the cracks is also etched. Consequently, the shape of the cracks is reflected in the shape of the opening part 15.

Figure 8:
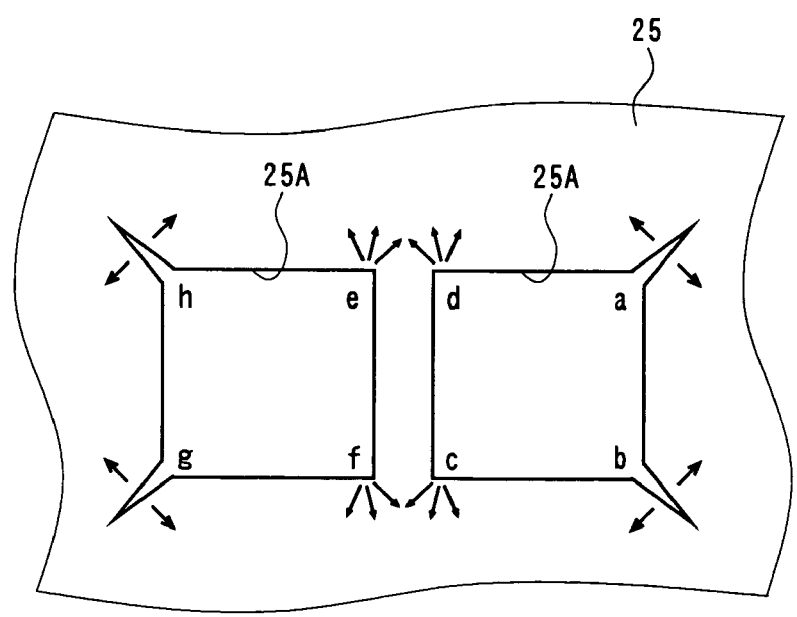
FIG. 8 is a plan view showing a case in which an opening part is formed adjacent to each other in a conventional example.

FIG. 8 shows the conditions of the occurrence of cracking of the resist pattern 25 in a case where opening parts 15 having a conventional shape are formed adjacent to each other. As is shown in FIG. 8, cracks tend to be generated more readily in the corner parts of an opening part 25A located on a side on which another opening part 25A is not disposed in an adjacent position (side on which an opening part is not located in close proximity), and less readily in the corner parts of an opening part 25A located on a side on which another opening part 25A is disposed in an adjacent position (side on which an opening part is located in close proximity). This is because stress is dispersed between the corner part d and corner part e, and between the corner part c and corner part f, on the side on which another opening part is located in close proximity, whereas stress is concentrated in the respective corner parts a, b, g, and h on the side on which another opening part is not located in close proximity.

Figure 9:
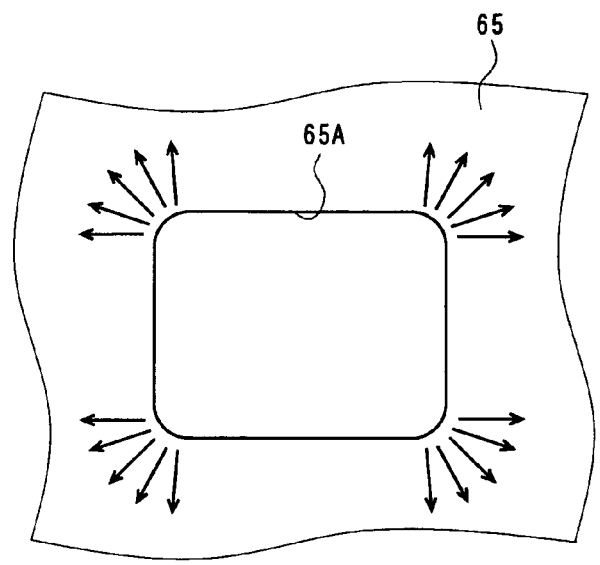
FIG. 9 is a plan view of the resist pattern following post baking in the present invention.

FIG. 9 is a plan view of the resist pattern 25 in the present embodiment. The arrows in the figure indicate stress. Furthermore, the numbers in this figure are assigned so as to be shared in common with FIG. 3 and FIG. 4 showing the light detector 50 of the present embodiment.

In the present embodiment, as is shown in FIG. 3, the opening part 55 is opened so as to have a planar shape having no corners. Consequently, an opening part 65A having the same shape as the opening part 55 is also formed in the resist pattern 65 used to form the opening part 55. Accordingly, as is shown in FIG. 9, the resist pattern 65 is also formed in a planar shape having no corners, and stress caused by the curing of the resist is accordingly dispersed. Consequently, the resist pattern 65 is resistant to cracking occurring.

Figure 10:
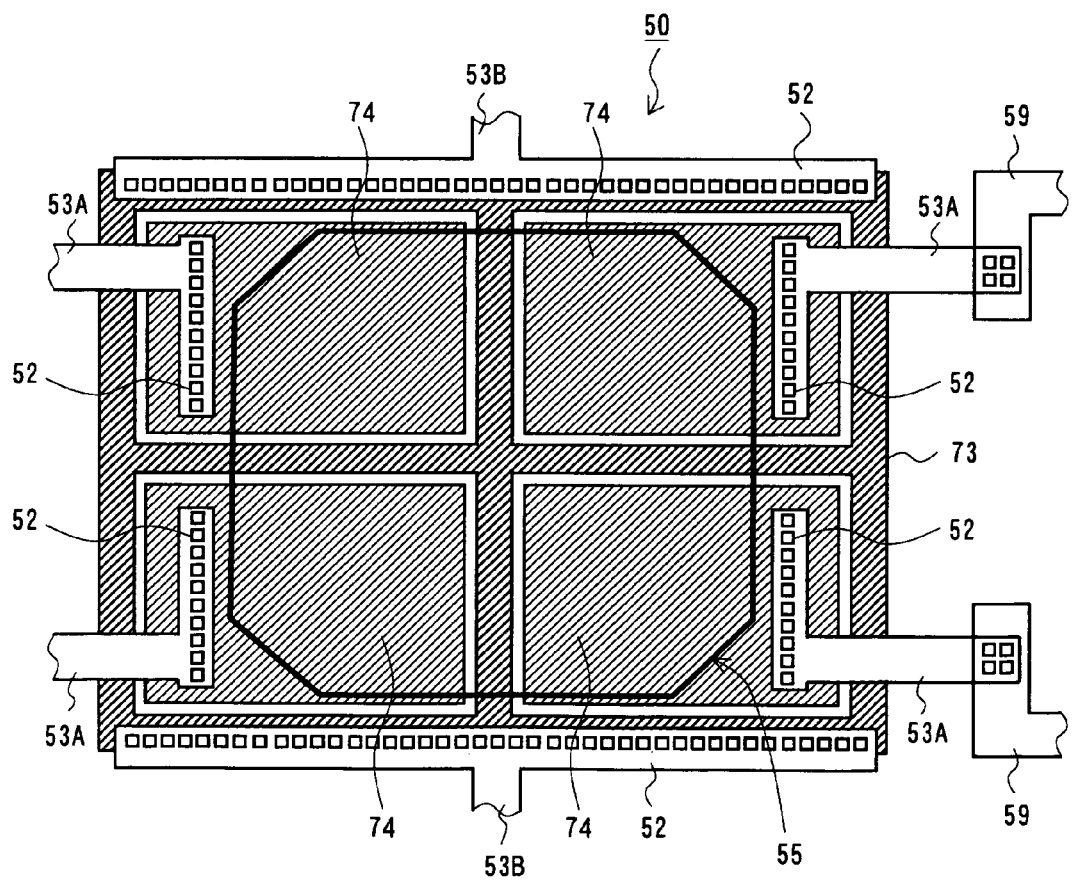
FIG. 10 is a schematic plan view of the light detector of the present invention.

Furthermore, the present invention is not limited to a structure in which the opening part 65A of the resist pattern 65 is formed so that the planar shape of the opening part 55 assumes a circular arc in the portions corresponding to the corner parts of the wiring structure 52, as described in the abovementioned embodiment. Forming the opening part 65A of the resist pattern 65 so as to yield a planar shape of the opening part 55 in which the portions corresponding to the corner parts of the wiring structure 52 are chamfered also allows the stress to be dispersed, and stress failures of the resist pattern 65 to be restrained. Accordingly, for example, as is shown in FIG. 10, a resist pattern wherein the planar shape of the opening part 55 is octagonal may also be used. The opening part 55 or opening part 65A may have a polygonal shape having eight or more sides.

Figure 11:
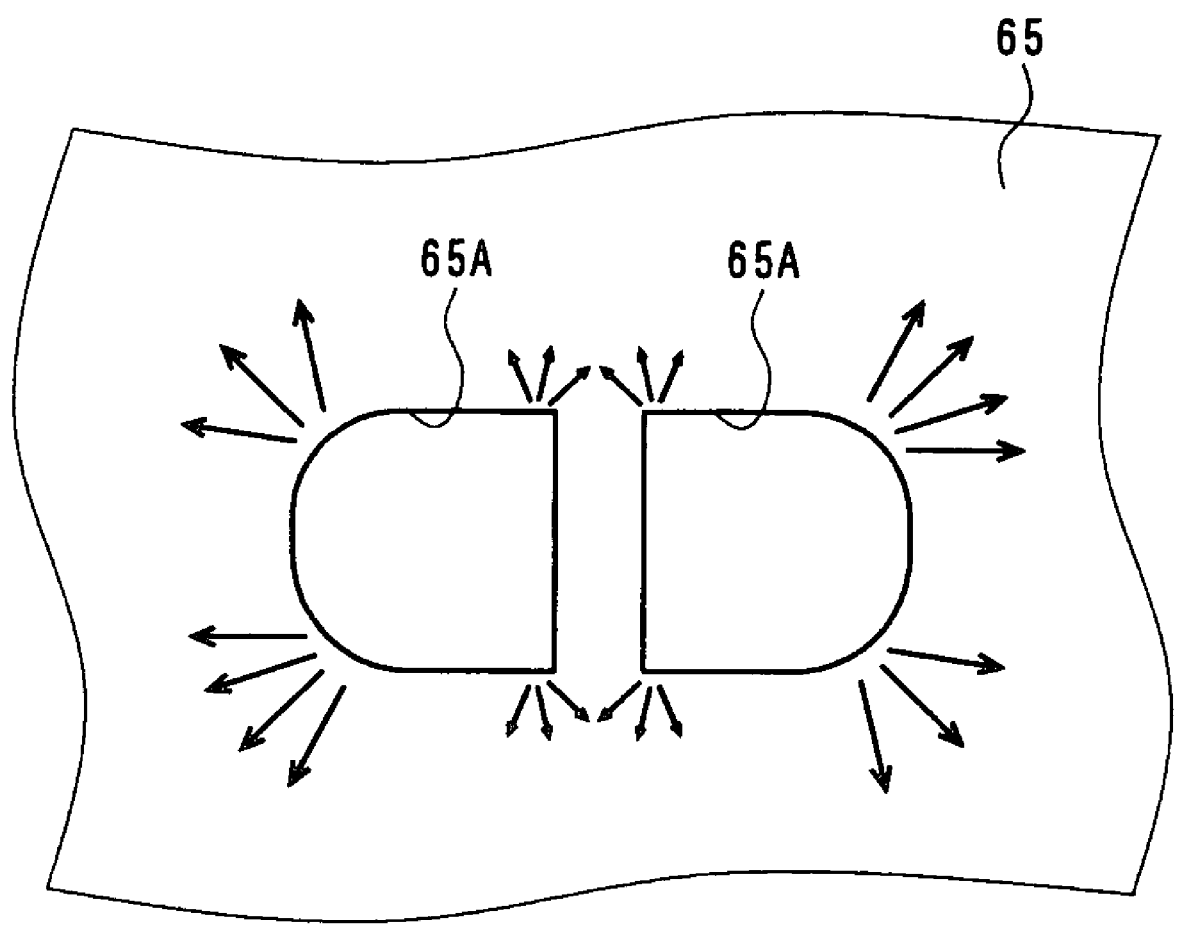
FIG. 11 is a plan view showing a case in which opening parts are formed adjacent to each other in the present invention.

Furthermore, in cases where the opening parts 55 are formed adjacent to each other as shown in FIG. 11, the resist pattern 65 can be formed so that the opening part 55 has a shape similar to that of the lower layer wiring structure 52 on the side on which another opening part is in close proximity, and so that a planar shape having a circular arc shape is formed on the side on which no opening part is in close proximity. In the case of this resist pattern 65, the corner parts of the opening part 65A on the side where another opening part is in close proximity disperse stress where the corner parts of the opening part 65A are adjacent, so that cracking tends not to occur. Accordingly, a shape is employed in which the stress concentration is alleviated only on the side on which no opening part is in close proximity.

Furthermore, in the present invention, as was described above, there is no need to introduce new devices or steps other than the changing of the mask that is used when the opening part is formed.

The present invention makes it possible to restrain etching portions other than the opening part when the opening part is formed in a method for manufacturing a semiconductor integrated circuit that has a photoreceptor part.

What is claimed is:

1. A method for manufacturing a semiconductor integrated circuit device, comprising:
    forming an inter-layer insulating film on a semiconductor substrate containing a photoreceptor part;
    coating the inter-layer insulating film with a resist;
    forming the resist into a resist pattern;
    hardening the resist pattern; and
    etching the inter-layer insulating film by using the resist pattern as a mask; wherein
    an opening part having a planar shape that is devoid of corners is formed in the resist pattern on top of the photoreceptor part.

2. A method for manufacturing a semiconductor integrated circuit device, comprising:
    forming on a semiconductor substrate having a photoreceptor part a wiring structure that is disposed on an edge of the photoreceptor part, and that surrounds the photoreceptor part in a planar shape that has corner parts;
    forming an inter-layer insulating film on the semiconductor substrate and wiring structure;
    coating a surface of the inter-layer insulating film with a resist;
    forming the resist into a resist pattern;
    hardening the resist pattern; and
    etching the inter-layer insulating film by using the resist pattern as a mask; wherein
    an opening part having a planar shape in which the portions corresponding to the corner parts are chamfered is formed in the resist pattern in an area surrounded by the wiring structure.

3. The method for manufacturing a semiconductor integrated circuit according to claim 2, wherein the planar shape of the opening part is a polygonal shape that has eight or more sides.

4. The method for manufacturing a semiconductor integrated circuit device according to claim 2, wherein the portions corresponding to the corner parts of the opening part are formed in the shape of a circular arc.

* * * * *